(12) United States Patent
Xia et al.

(10) Patent No.: US 12,394,745 B2
(45) Date of Patent: Aug. 19, 2025

(54) SEMICONDUCTOR DEVICE INCLUDING BONDING COVERS

(71) Applicant: SEMICONDUCTOR COMPONENTS INDUSTRIES, LLC, Phoenix, AZ (US)

(72) Inventors: Wuxing Xia, Suzhou (CN); Ye Jin, Suzhou (CN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 637 days.

(21) Appl. No.: 17/660,076

(22) Filed: Apr. 21, 2022

(65) Prior Publication Data

US 2023/0343739 A1    Oct. 26, 2023

(51) Int. Cl.
*H01L 23/00* (2006.01)
*H01L 23/495* (2006.01)

(52) U.S. Cl.
CPC .............. *H01L 24/45* (2013.01); *H01L 24/48* (2013.01); *H01L 23/49562* (2013.01); *H01L 2224/45541* (2013.01); *H01L 2224/4555* (2013.01); *H01L 2224/4556* (2013.01); *H01L 2224/45565* (2013.01); *H01L 2224/4569* (2013.01); *H01L 2224/48245* (2013.01); *H01L 2224/48455* (2013.01)

(58) Field of Classification Search
None
See application file for complete search history.

(56) References Cited

U.S. PATENT DOCUMENTS

| 6,667,547 | B2 | 12/2003 | Woodworth et al. |
| 7,781,897 | B2* | 8/2010 | Hosseini .............. H01L 23/3121 257/784 |
| 8,253,225 | B2* | 8/2012 | Otremba ................. H01L 24/49 257/735 |
| 2003/0143104 | A1 | 7/2003 | Kitajima et al. |
| 2005/0205995 | A1 | 9/2005 | Ishikawa et al. |
| 2010/0025849 | A1 | 2/2010 | Koh et al. |

* cited by examiner

*Primary Examiner* — Kyoung Lee
(74) *Attorney, Agent, or Firm* — Brake Hughes Bellermann LLP

(57) ABSTRACT

A semiconductor device includes a die pad, a bond post, a die disposed over the die pad, a wire coupled between the die and the bond post and having a first portion bonded to the die at a first bond area and a second portion bonded to the bond post at a second bond area, a first bonding cover disposed over the first portion, and a second bonding cover disposed over the second portion. A method includes bonding a first portion of a wire to a die at a first bond area, bonding a second portion of the wire to a first bond post of a lead frame at a second bond area, applying a bonding material over the first bond area to form a first bonding cover, and applying the bonding material over the second bond area to form a second bonding cover.

22 Claims, 5 Drawing Sheets

SEMICONDUCTOR DEVICE INCLUDING BONDING COVERS

BACKGROUND

The present disclosure relates to a semiconductor device, a package device including the semiconductor device, and a method for forming the package device.

Power semiconductor devices are used in many different industries. Some of these industries, such as telecommunications, computing and charging systems, are rapidly developing.

Power semiconductor devices may have a packaged structure for protecting integrated circuits (ICs) from physical or chemical attack. Such a packaged structure may include a die, a molded housing, and a lead frame including a plurality of bond posts. The die may be wired bonded to a plurality of bond posts. After a wire is bonded between the die and one of the bond posts, an end portion of the wire may become detached from a bonding area on the die or broken above the bonding area, leading to loss or deterioration of electrical and mechanical connection between the wire and the bonding area.

SUMMARY

Embodiments of the present application relate to a semiconductor device, a package device including the semiconductor device, and a method for forming the package device.

In an embodiment, a semiconductor device includes a lead frame including a die pad, a first bond post, and a first lead conductor coupled to the first bond post, a die disposed over the die pad, a first wire coupled between the die and the first bond post, the first wire having a first portion bonded to the die at a first bond area and a second portion bonded to the first bond post at a second bond area, a first bonding cover disposed over the first portion of the first wire, and a second bonding cover disposed over the second portion of the first wire.

In an embodiment, a package device includes a lead frame including a die pad, a first bond post, a second bond post, a first lead conductor coupled to the first bond post, and a second lead conductor coupled to the second bond post, a die disposed over the die pad, a first wire coupled between the die and the first bond post, the first wire having a first portion bonded to the die at a first bond area and a second portion bonded to the first bond post at a second bond area, a second wire coupled between the die and the second bond post, the second wire having a third portion bonded to the die at a third bond area and a fourth portion bonded to the second bond post at a fourth bond area, a first bonding cover disposed over the first portion of the first wire, a second bonding cover disposed over the second portion of the first wire, a third bonding cover disposed over the third portion of the second wire, a fourth bonding cover disposed over the fourth portion of the second wire, and a molded housing encapsulating the die.

In an embodiment, a method for forming a package device includes bonding a first portion of a wire to a die at a first bond area, bonding a second portion of the wire to a first bond post of a lead frame at a second bond area, applying a bonding material over the first bond area to form a first bonding cover, and applying the bonding material over the second bond area to form a second bonding cover.

DETAILED DESCRIPTION

Embodiments of the present application relate to a semiconductor device, a package device including the semiconductor device, and a method for forming the package device.

In an embodiment, a semiconductor device includes a bonding cover that is disposed over an end portion of a wire and encompasses a bond area between the wire and a die or between the wire and a bond post of a lead frame. Accordingly, bond strength of the wire at the bond area may be sufficient to prevent an occurrence of one or more defects at the bond area, thereby improving process reliability.

In an embodiment, a semiconductor device includes one or more bonding covers each include a conductive epoxy material. Accordingly, electrical connection between a first end portion of a wire and a die at a first bond area and electrical connection between a second end portion of the wire and a bond post of a lead frame at a second bond area may be ensured.

In an embodiment, a method for forming a package device includes curing an epoxy material with a given temperature profile. Since a temperature for curing the epoxy material is relatively low, bonding covers in the package device may be formed without overheating and damaging one or more electrical components beyond their temperature tolerance.

A detailed description of embodiments is provided below along with accompanying figures. The scope of this disclosure is limited only by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Figure 1:
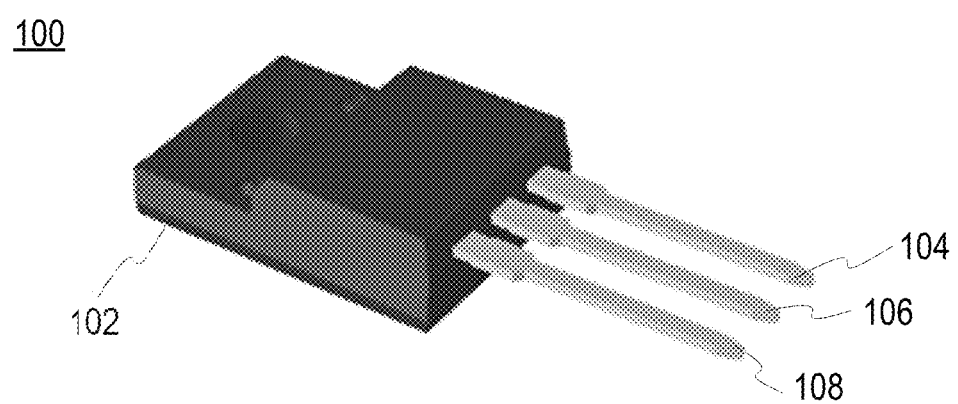
FIG. 1 illustrates a package device according to an embodiment of the present disclosure.

FIG. 1 illustrates a package device 100 according to an embodiment of the present disclosure. The package device 100 includes a molded housing 102 encapsulating one or more dies (e.g., a die 220 in FIGS. 2A and 2B), one or more bonding wires (e.g., a wire 228 in FIG. 2B), and a lead frame (e.g., a lead frame 270 in FIG. 2A) including a plurality of lead conductors 104, 106, and 108.

The plurality of lead conductors 104, 106, and 108 each protrude from a side surface of the molded housing 102 and extend in a given direction. In an embodiment, the plurality of lead conductors 104, 106, and 108 function as respective terminals for a die in the package device 100. For example, the plurality of lead conductors 104, 106, and 108 may couple source, drain, and gate electrodes for a MOSFET die in the package device 100 to corresponding components outside the package device 100.

Figure 2A:
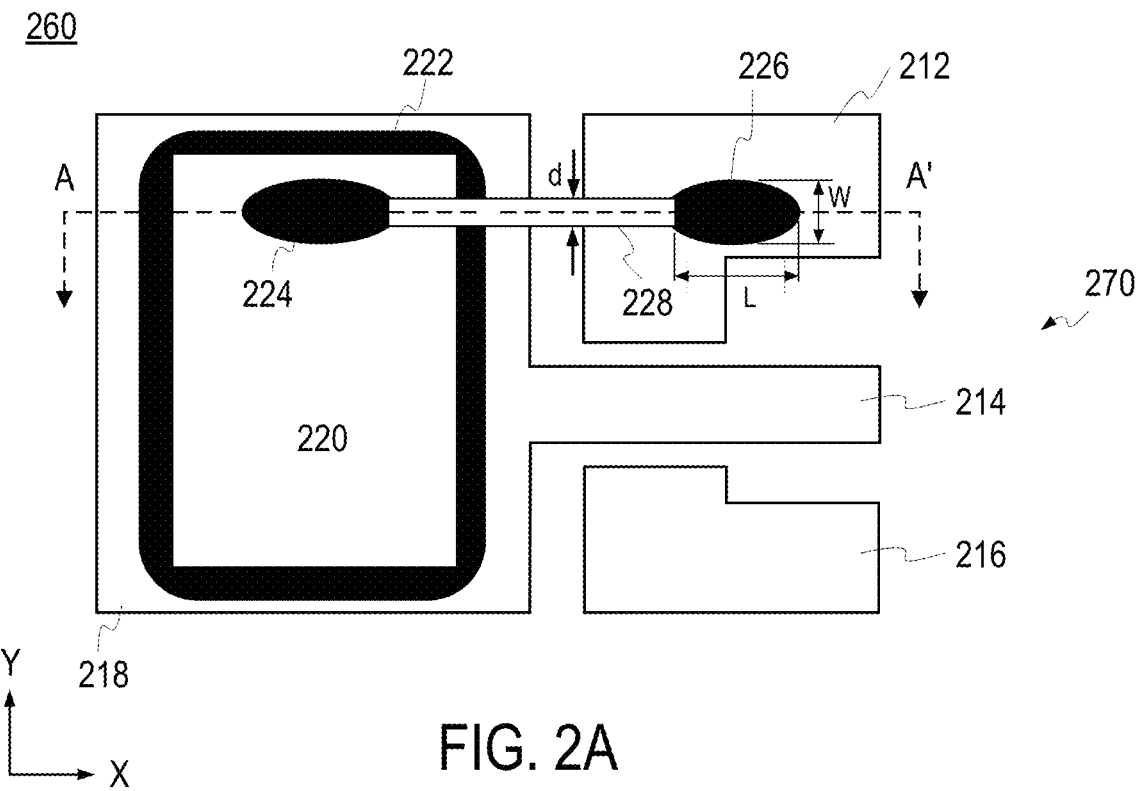
FIGS. 2A and 2B are a plan view and a cross-section view illustrating a portion of a package device according to an embodiment of the present disclosure.
Figure 2B:
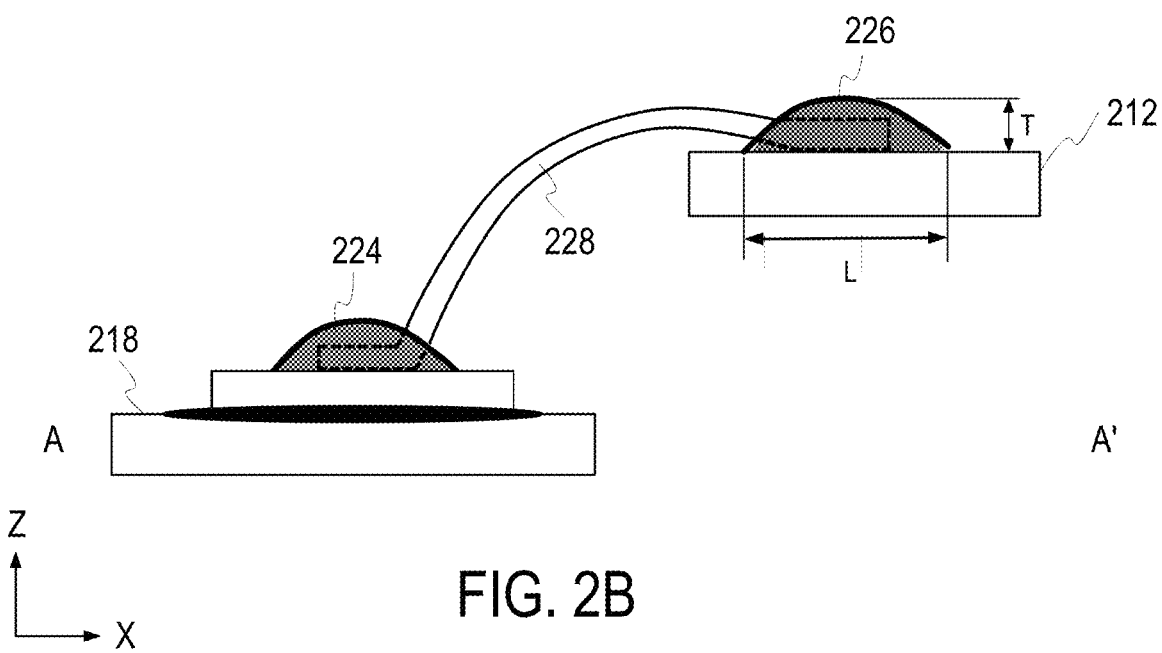

FIG. 2A is a plan view illustrating a portion 260 of a package device (e.g., the package device 100), which can be encapsulated by a molded housing (e.g., the molded housing 102 in FIG. 1), according to an embodiment. FIG. 2B is a cross-sectional view across a line AA' of FIG. 2A according to an embodiment. The portion 260 includes a lead frame 270, a die pad 218, a die attachment layer 222, a die 220, a wire 228, and first and second bonding covers 224 and 226. The lead frame 270 includes a first bond post 212, a second bond post 216, and an extension 214.

The die 220 is disposed over the die pad 218, such that an upper surface of the die pad 218 is bonded to a lower surface of the die 220 by the die attachment layer 222 using soldering or the like.

Each of the first bond post 212 and the second bond post 216 may be disposed adjacent to the die pad 218 and spaced apart from the die pad 218 in a first direction (e.g., the X-direction in FIGS. 2A and 2B) by a first given distance. In an embodiment, the first bond post 212 and the second bond post 216 are substantially coplanar and disposed over a plane of the upper surface of the die pad 218. For example, each of the first and second bond posts 212 and 216 is spaced apart from the die pad 218 in a second direction (e.g., the Z-direction in FIG. 2B) by a second given distance.

The first bond post 212 may be coupled to a first lead conductor (e.g., the lead conductor 104 in FIG. 1), and the second bond post 216 may be coupled to a second lead conductor (e.g., the lead conductor 108 in FIG. 1). In an embodiment, the first lead conductor couples a first electrode (e.g., a source electrode) of the die 220 to a first external component and the second lead conductor couples a second electrode (e.g., a gate electrode) of the die 220 to a second external component.

The extension 214 may be disposed between the first bond post 212 and the second bond post 216 and coupled to a third lead conductor (e.g., the lead conductor 106 in FIG. 1). In an embodiment, the extension 214 substantially aligns with the third lead conductor that couples a third electrode (e.g., a drain electrode) of the die 220 to an external component.

The wire 228 is bonded to the die 220 at a first bond area and to the first bond post 212 at a second bond area. For example, the wire 228 may include one or more of Aluminum (Al), Copper (Cu), and gold (Au).

Although the embodiment shown in FIGS. 2A and 2B shows that the die 220 is wire bonded to the first bond post 212 by a single wire 228, embodiments of the present disclosure are not limited thereto. For example, the die 220 may be wire bonded to the first bond post 212 by two or more wires (not shown). In addition, the die 220 may be wire bonded to the second bond post 216 by one or more wires (not shown).

The first bonding cover 224 is disposed over a first end portion of the wire 228 and the first bond area of the die 220, and the second bonding cover 226 is disposed over a second end portion of the wire 228 and the second bond area of the first bond post 212. Each of the first and second bonding covers 224 and 226 may have a size sufficient to substantially prevent an occurrence of one or more defects (e.g., a wire lift, a heel crack, etc.) at a bond area, thereby improving process reliability. In an embodiment, each of the first and second bonding covers 224 and 226 encompasses a corresponding one of the first and second bond areas, where the first bond area may be a first bond stitch area at which the wire 228 is bonded to the die 220 and the second bond area may be a second bond stitch area at which the wire 228 is bonded to the first bond post 212. For example, a first length W (e.g., about 1.0 mm) of the second bonding cover 226 in a first direction (e.g., the Y-direction) may be in a range from 4 to 12 times, 7 to 9 times, or 7.5 to 8.5 times as great as that (e.g., about 0.125 mm) of the second bond area in the first direction, and a second length L (e.g., about 1.0 mm) of the second bonding cover 226 in a second direction (e.g., the X-direction) may be in a range from 1.5 to 6.5 times, from 3 to 5 times, or from 3.5 to 4.5 times as great as that (e.g., 0.25 mm) of the second bond area in the second direction, the second direction intersecting with the first direction. In an embodiment, a thickness of each of the first and second bonding covers 224 and 226 is sufficiently thick to cover a corresponding portion of the wire 228 at the first bond area or the second bond area. For example, a maximum thickness T of the second bonding cover 226 at the second bond area may be in a range from 105% to 135%, from 110% to 130%, or from 115% to 125% of a diameter d (e.g., about 0.05 mm, about 0.125 mm, or about 0.15 mm) of the wire 228.

Figure 3:
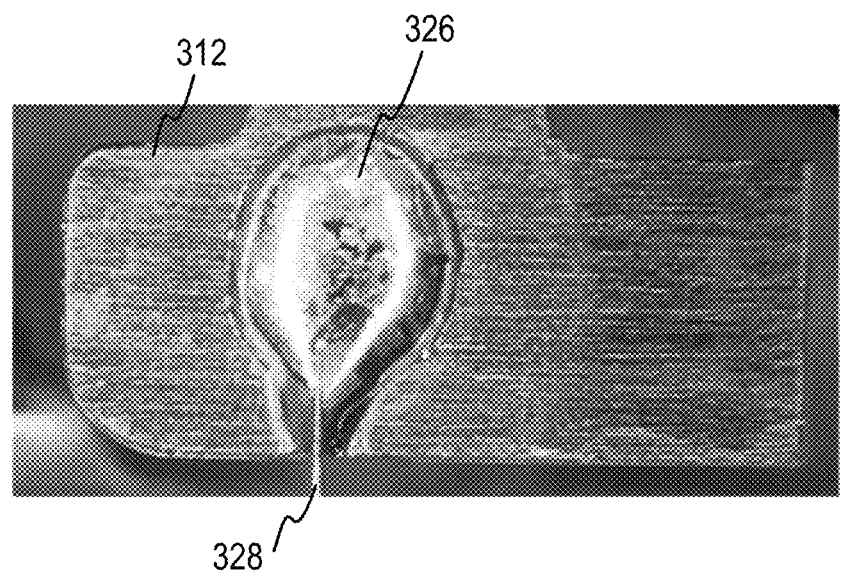
FIG. 3 illustrates a bonding cover according to an embodiment of the present disclosure.

FIG. 3 shows a bonding cover (e.g., a solder cover) 326 according to an embodiment. For example, the solder cover 326 in FIG. 3 may be suitable for use as the first bonding cover 224, or the second bonding cover 226, or both shown in FIGS. 2A and 2B.

In the embodiment of FIG. 3, the solder cover 326 includes a solder material. For example, the solder cover 326 may include a Sn—Ag solder alloy or a Pb—Sn—Ag solder alloy.

Figure 4:
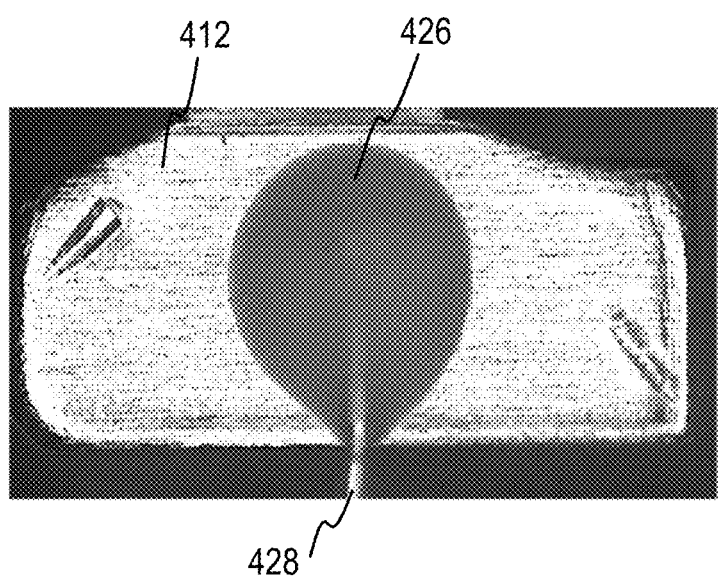
FIG. 4 illustrates a bonding cover according to another embodiment of the present disclosure.

FIG. 4 shows a bonding cover (e.g., an epoxy cover) 426 according to another embodiment. For example, the epoxy cover 426 in FIG. 4 may be suitable for use as the first bonding cover 224, or the second bonding cover 226, or both shown in FIGS. 2A and 2B.

In the embodiment of FIG. 4, the epoxy cover 426 includes an epoxy material. For example, the epoxy cover 426 may include a conductive epoxy material (e.g., Ag-epoxy, Sn—Ag epoxy, or Pb—Sn—Ag epoxy), thereby ensuring electrical connection between a first end portion of the wire 428 and a die (e.g., the die 220 in FIGS. 2A and 2B) at a first bond area and electrical connection between a second end portion of the wire 428 and a first bond post 412 at a second bond area. However, embodiments of the present disclosure are not limited thereto. For example, the epoxy cover 426 may include a non-conductive epoxy material (e.g., $Al_2O_3$ epoxy).

Figure 5:
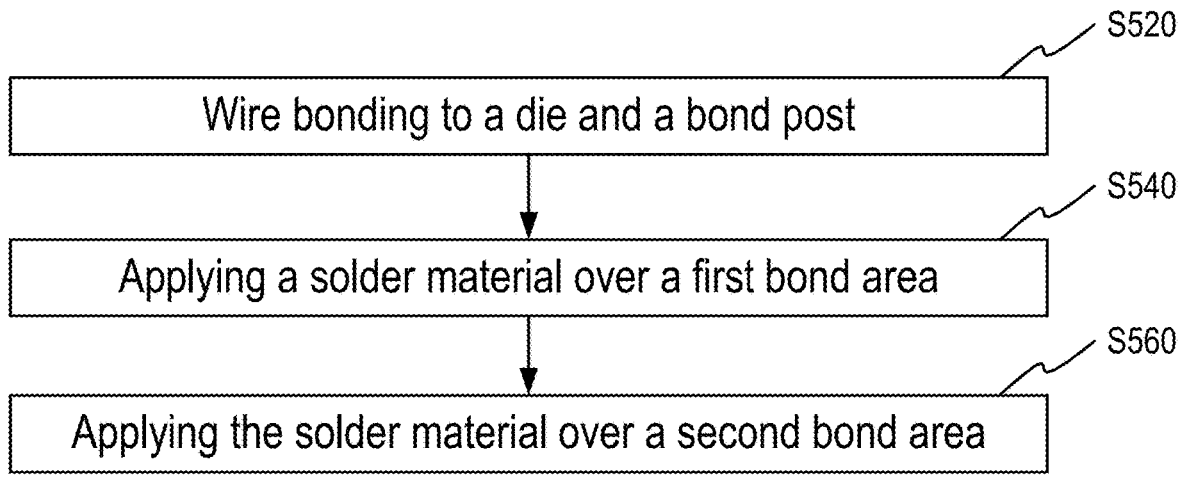
FIG. 5 illustrates aspects of a method for forming a package device according to an embodiment.

FIG. 5 illustrates aspects of a method for forming a package device (e.g., the package device 100 in FIG. 1) according to an embodiment. More specifically, FIG. 5 illustrates processes of forming a wire (e.g., the wire 228 in FIGS. 2A and 2B) and bonding covers (e.g., the solder cover 326 in FIG. 3) according to an embodiment. Descriptions on the remaining processes of forming the package are omitted herein for the interest of brevity.

At S520, the wire is bonded to a die (e.g., the die 220 in FIGS. 2A and 2B) at a first bond area and to a bond post (e.g., the first bond post 212 in FIGS. 2A and 2B) at a second bond area. In an embodiment, a wedge bonding process is performed to bond a first portion of the wire to the die at the first bond area, create a loop portion of the wire, and then bond a second portion of the wire to the bond post at the second bond area. However, embodiments of the present disclosure are not limited thereto. For example, a ball bonding process may be performed to bonding the wire to the die and the bond post.

At S540, a solder material is applied over a first bond area at which the wire is bonded to the die. In an embodiment, a soldering device is provided over the first bond area and a solder wire descends from the soldering device over the first bond area. A temperature of a die attach track (not shown) in which the die and the wire are disposed may be controlled such that an end portion of the soldering wire melts and wets the first bond area when the end portion of the soldering wire approaches sufficiently close to the wire at the first bond area. For example, the temperature of the die attach track may be substantially kept in a range from 340 to 400° C. during a given time interval (e.g., 1 to 2 minutes). After applying a given amount of the solder material over the first bond area, the soldering device may stop applying the solder material to form a first bonding cover (e.g., the first bonding cover 224 in FIGS. 2A and 2B).

At S560, the solder material is applied over a second bond area at which the wire is bonded to the bond post. In an embodiment, the soldering device moves from the first bond area to the second bond area, and then the solder wire descends from the soldering device over the second bond area. An end portion of the soldering wire melts and wets the second bond area when the end portion of the soldering wire approaches sufficiently close to the wire at the second bond area. After applying a given amount of the solder material over the second bond area, the soldering device may stop applying the solder material to form a second bonding cover (e.g., the second bonding cover 226 in FIGS. 2A and 2B).

Figure 6:
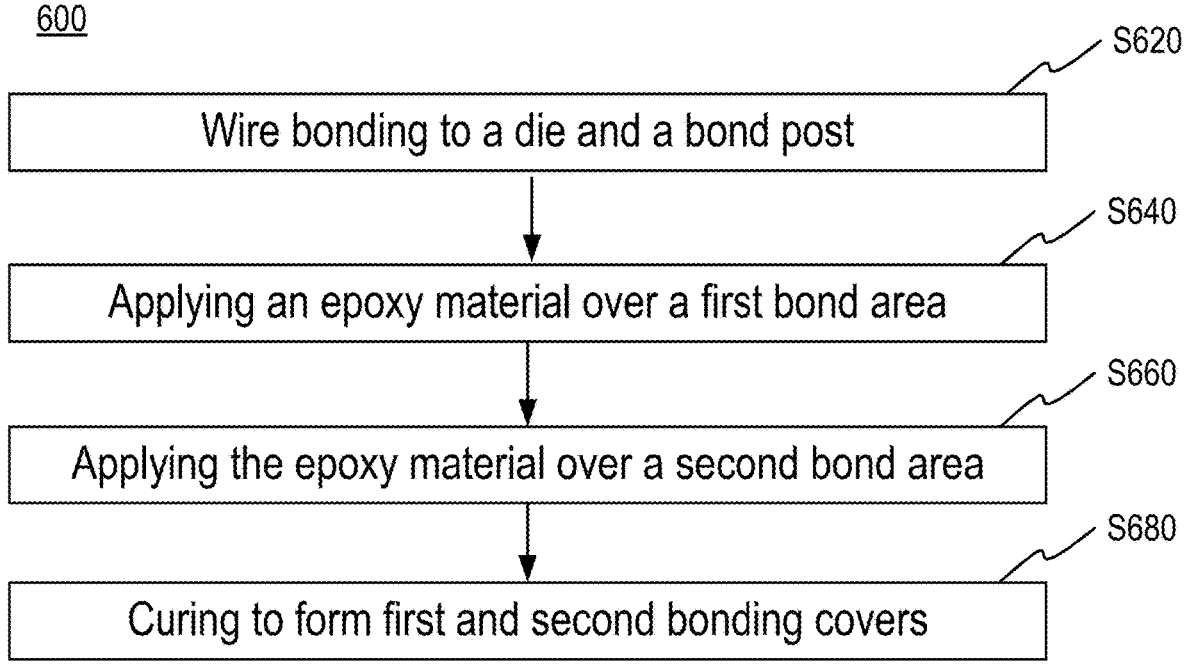
FIG. 6 illustrates aspects of a method for forming a package device according to another embodiment.

FIG. 6 illustrates aspects of a method 600 of forming a package device (e.g., the package device 100 in FIG. 1) according to an embodiment. More specifically, FIG. 6 illustrates processes of forming bonding covers (e.g., the epoxy cover 426 in FIG. 4) according to an embodiment. Descriptions on the remaining processes of forming the package are omitted herein for the interest of brevity.

At S620, a wire is bonded to a die (e.g., the die 220 in FIGS. 2A and 2B) at a first bond area and to a bond post (e.g., the first bond post 212 in FIGS. 2A and 2B) at a second bond area. The wire bonding process at S620 may be similar to that at S520 in FIG. 5, and thus detailed descriptions on the wire bonding process are omitted herein for the interest of brevity.

At S640, an epoxy material is applied over a first bond area at which a wire (e.g., the wire 228 in FIGS. 2A and 2B) is bonded to a die (e.g., the die 220 in FIGS. 2A and 2B). In an embodiment, an ejection device is provided over the first bond area and descends sufficiently close to the wire at the first bond area to apply the epoxy material from an end portion of the ejection device. After applying a given amount of the epoxy material over the first bond area, the ejection device may stop applying the epoxy material.

At S660, the epoxy material is applied over a second bond area at which the wire is bonded to the bond post. In an embodiment, the ejection device moves from the first bond area to the second bond area, and then descends sufficiently close to the wire at the second bond area to apply the epoxy material from the end portion of the ejection device over the second bond area. After applying a given amount of the epoxy material over the second bond area, the ejection device may stop applying the epoxy material.

At S680, the epoxy material applied over the first and second bond areas is cured to form first and second bonding covers (e.g., the first and second bonding covers 224 and 226 in FIGS. 2A and 2B) at the first and second bond areas, respectively. In an embodiment, a plurality of portions each including a die pad, a die, a lead frame, one or more bonding wires, and the applied epoxy material may be disposed in an oven and cured with a given temperature profile. For example, the temperature of the oven may increase from a room temperature to a given temperature (e.g., a temperature in a range between 160 to 190° C.) during a first time interval (e.g., 20 to 40 minutes), substantially remain at the given temperature during a second time interval (e.g., 20 to 40 minutes), and then decreases to the room temperature during a third time interval (e.g., 40 to 60 minutes). Since the temperature of the oven for curing the epoxy material is relatively low, the bonding covers may be formed without overheating and damaging one or more electrical components of the plurality of portions beyond their temperature tolerance.

Figure 7:
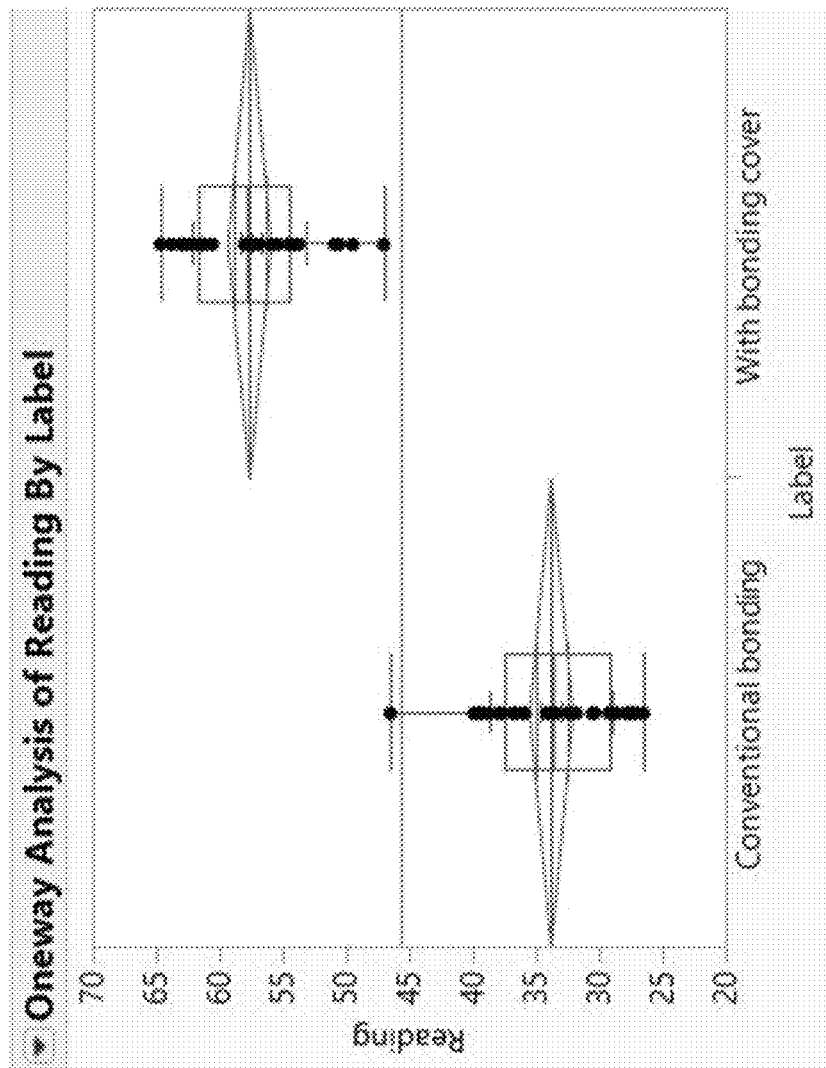
FIG. 7 illustrates pull test results of a wire with bonding covers according to an embodiment of the present disclosure compared to those of a conventional wire.

FIG. 7 illustrates pull test results of a first wire (e.g., the wire 228 in FIGS. 2A and 2B) with bonding covers (e.g., the first and second bonding covers 224 and 226 in FIGS. 2A and 2B) according to an embodiment of the present disclosure, compared to those of a second wire formed using a conventional wire bonding process. In the embodiment of FIG. 7, a midspan pull test is performed on the first and second wires using DAGE 4000 machine.

In the embodiment of FIG. 7, the bond strength of the first wire with epoxy covers (e.g., the epoxy cover 426 in FIG. 4) is greater than that of the second wire formed using a conventional wire bonding process. For example, the average force required to break the bond of the first wire with the epoxy covers may be increased by about 70% compared to that of the second wire formed using the conventional wire bonding process. The increased bond strength of the first wire at a bond area may be sufficient to prevent an occurrence of one or more defects at the bond area, thereby improving process reliability.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. A semiconductor device, comprising:
a lead frame including a die pad, a first bond post, and a first lead conductor coupled to the first bond post;
a die disposed over the die pad; a first wire coupled between the die and the first bond post, the first wire having a first portion bonded to the die at a first bond area and a second portion bonded to the first bond post at a second bond area;
a first bonding cover disposed over the first portion of the first wire, the first bonding cover having a length greater than a thickness of the first bonding cover; and
a second bonding cover disposed over the second portion of the first wire.

2. The semiconductor device of claim 1, wherein the first bonding cover encompasses the first bond area, and the second bonding cover encompasses the second bond area.

3. The semiconductor device of claim 1, wherein a length of the second bonding cover in a direction is in a range of 4 to 12 times as great as a length of the second bond area in the direction.

4. The semiconductor device of claim 1, wherein:
a first length of the second bonding cover in a first direction is in a range of 4 to 12 times as great as a first length of the second bond area in the first direction, and
a second length of the second bonding cover in a second direction is in a range of 1.5 to 6.5 times as great as a second length of the second bond area in the second direction, the second direction intersecting with the first direction.

5. The semiconductor device of claim 1, wherein a thickness of the second bonding cover is in a range of 105% to 135% of a diameter of the first wire.

6. The semiconductor device of claim 1, wherein each of the first bonding cover and the second bonding cover includes a solder material.

7. The semiconductor device of claim 1, wherein each of the first bonding cover and the second bonding cover includes an epoxy material.

8. The semiconductor device of claim 1, wherein each of the first bonding cover and the second bonding cover includes a conductive epoxy material.

9. The semiconductor device of claim 8, wherein the conductive epoxy material includes at least one of a silver (Ag)-epoxy, a Tin (Sn)—Ag epoxy, or a lead (Pb)—Sn—Ag epoxy).

10. The semiconductor device of claim 1, further comprising:
a second wire coupled between the die and the first bond post, the second wire having a third portion bonded to the die at a third bond area and a fourth portion bonded to the first bond post at a fourth bond area;
a third bonding cover disposed over the third portion of the second wire; and
a fourth bonding cover disposed over the fourth portion of the second wire.

11. The semiconductor device of claim 1, wherein the lead frame further includes a second bond post and a second lead conductor coupled to the second bond post,
the semiconductor device further comprising:
a second wire coupled between the die and the second bond post, the second wire having a third portion bonded to the die at a third bond area and a fourth portion bonded to the second bond post at a fourth bond area;
a third bonding cover disposed over the third portion of the second wire; and
a fourth bonding cover disposed over the fourth portion of the second wire.

12. The semiconductor device of claim 1, wherein the first wire is wedge bonded to the die and the first bond post.

13. The semiconductor device of claim 1, wherein the first bonding cover has a non-uniform thickness across the length of the first bonding cover.

14. A package device, comprising:
a lead frame including a die pad, a first bond post, a second bond post, a first lead conductor coupled to the first bond post, and a second lead conductor coupled to the second bond post;
a die disposed on the die pad;
a first wire coupled between the die and the first bond post, the first wire having a first portion bonded to the die at a first bond area and a second portion bonded to the first bond post at a second bond area;
a second wire coupled between the die and the second bond post, the second wire having a third portion bonded to the die at a third bond area;
a first bonding cover disposed over the first portion of the first wire such that the first wire extends from the first bonding cover below a top surface of the first bonding cover;
a second bonding cover disposed over the second portion of the first wire;
a third bonding cover disposed over the third portion of the second wire; and
a molded housing encapsulating the die.

15. The package device of claim 14, wherein the first bonding cover encompasses the first bond area, and the second bonding cover encompasses the second bond area.

16. The package device of claim 14, wherein a length of the second bonding cover in a direction is in a range of 4 to 12 times as great as a length of the second bond area in the direction.

17. The package device of claim 14, wherein;
a first length of the second bonding cover in a first direction is in a range of 4 to 12 times as great as a first length of the second bond area in the first direction, and
a second length of the second bonding cover in a second direction is in a range of 1.5 to 6.5 times as great as a second length of the second bond area in the second direction, the second direction intersecting with the first direction.

18. The package device of claim 14, wherein a thickness of the second bonding cover is in a range of 105% to 135% of a diameter of the first wire.

19. A method, the method comprising:
bonding a first portion of a wire to a die at a first bond area;
bonding a second portion of the wire to a first bond post of a lead frame at a second bond area;
applying a bonding material over the first bond area to form a first bonding cover having a thickness that tapers along a length of the first bonding cover; and
applying the bonding material over the second bond area to form a second bonding cover.

20. The method of claim 19, wherein the bonding material is a solder material, the method further comprising controlling a temperature of a die attach track in which the die and the wire is provided.

21. The method of claim 19, wherein the bonding material is an epoxy material, the method further comprising curing the epoxy material with a given temperature profile.

22. The method of claim 19, wherein the first bonding cover encompasses the first bond area, and the second bonding cover encompasses the second bond area.

* * * * *